(12) United States Patent
Wang et al.

(10) Patent No.: US 10,727,377 B2
(45) Date of Patent: Jul. 28, 2020

(54) FULL-SPECTRUM LIGHT EMITTING DIODE AND APPLICATION THEREOF

(71) Applicant: HIT INTERNATIONAL CONSULTING LLC, Chino, CA (US)

(72) Inventors: Tzuhsin Wang, Suzhou (CN); Shirong Wen, Suzhou (CN); Haifeng Zheng, Suzhou (CN); Daoguang Liu, Suzhou (CN); Hongbo Yan, Suzhou (CN); Jingjun Gu, Suzhou (CN)

(73) Assignee: HIT INTERNATIONAL CONSULTING LLC, Chino, CA (US)

( * ) Notice: Subject to any disclaimer, the term of this patent is extended or adjusted under 35 U.S.C. 154(b) by 135 days.

(21) Appl. No.: 16/309,265

(22) PCT Filed: May 24, 2016

(86) PCT No.: PCT/CN2016/083101
§ 371 (c)(1),
(2) Date: Dec. 12, 2018

(87) PCT Pub. No.: WO2017/032102
PCT Pub. Date: Mar. 2, 2017

(65) Prior Publication Data
US 2019/0221720 A1    Jul. 18, 2019

(30) Foreign Application Priority Data
Aug. 25, 2015    (CN) .......................... 2015 1 0541717

(51) Int. Cl.
*H01L 33/50* (2010.01)
*H01L 27/15* (2006.01)
*H01L 33/52* (2010.01)

(52) U.S. Cl.
CPC .......... *H01L 33/502* (2013.01); *H01L 27/153* (2013.01); *H01L 33/52* (2013.01); *H01L 33/504* (2013.01)

(58) Field of Classification Search
CPC ..... H01L 33/50; H01L 33/502; H01L 33/504; H01L 33/52; H01L 27/15; H01L 27/153
(Continued)

(56) References Cited

U.S. PATENT DOCUMENTS

| 6,555,958 B1 * | 4/2003 | Srivastava | .............. H01L 33/50 252/301.4 F |
| 7,074,346 B2 * | 7/2006 | Yamada | ................. C04B 35/597 252/301.4 F |
| 2013/0277694 A1 * | 10/2013 | Sakuta | ............... C09K 11/7739 257/89 |

* cited by examiner

*Primary Examiner* — Monica D Harrison
(74) *Attorney, Agent, or Firm* — AEON Law, PLLC; Adam L. K. Philipp; David V. H. Cohen

(57) ABSTRACT

Disclosed are a full-spectrum light emitting diode (LED) and applications thereof. A fluorescent powder composition is mixed with silica gel. In the mixture of the fluorescent powder composition and the silica gel, the mixture of the fluorescent powder composition and the silica gel is applied on blue LED chips. The blue LED chips are blue light emitting diode chips, and at least two blue LED chips are provided. The fluorescent powder composition includes fluorescent powder of at least two different colors. An excited spectrum is close to a plant photosynthesis curve, a meat irradiation curve, a biological growth curve, a seafood irradiation curve, a vegetable and fruit irradiation curve, and a pastry irradiation curve. A full-spectrum LED light source can be adjusted to simulate natural light irradiation. The excited spectrum is close to the plant photosynthesis curve, thereby causing photosynthesis in plants, achieving an optimal plant growth effect. Further, the present invention achieves optimal freshness preservation effects in meat (Continued)

irradiation, seafood irradiation, and vegetable and fruit irradiation, and ensures optimal deliciousness in pastry irradiation.

9 Claims, 1 Drawing Sheet

(58) Field of Classification Search
USPC .......................................................... 257/88
See application file for complete search history.

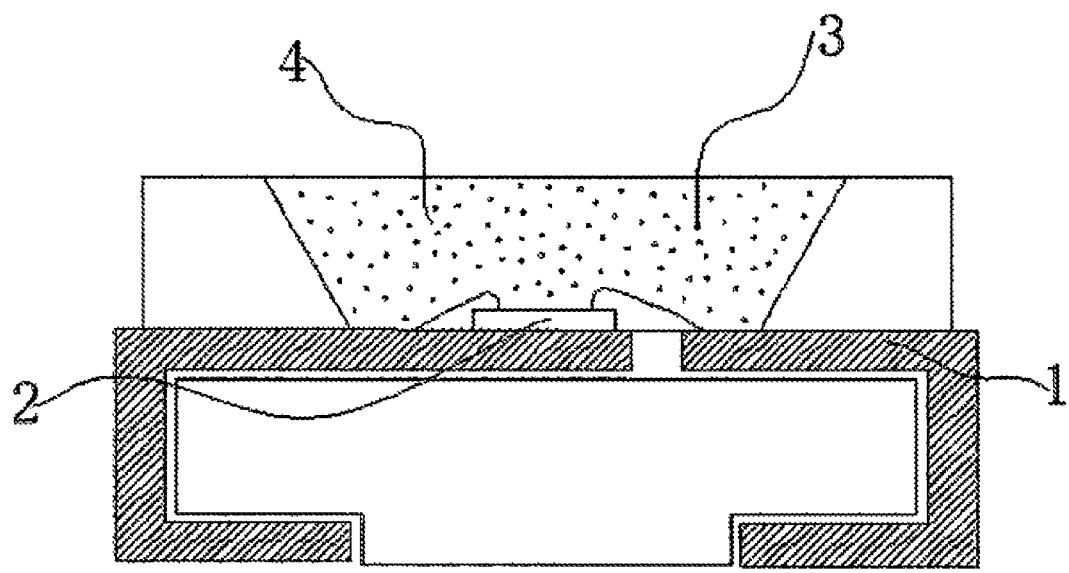

US 10,727,377 B2

FULL-SPECTRUM LIGHT EMITTING DIODE AND APPLICATION THEREOF

CROSS-REFERENCE TO RELATED APPLICATIONS

This application is a U.S. national phase entry of, and claims priority to, PCT International Phase Application No. PCT/CN2016/083101, filed May 24, 2016, which claims priority to Chinese Patent Application No. CN 201510541717.1, filed Aug. 25, 2015. The entire contents of the above-referenced applications and all priority documents referenced in the Application Data Sheet filed herewith are hereby incorporated by reference for all purposes.

TECHNICAL FIELD

The present invention relates to the technical field of light source configurations, and in particular to a full-spectrum light emitting diode (LED) and applications thereof.

BACKGROUND

A full-spectrum LED simulates the spectrum of natural light and contains the spectrum necessary for plant growth. Research on plant growth characteristics has shown that plant growth requirements vary based on different light intensity, spectrum, and photoperiod conditions. Among the plant growth requirements, photosynthesis is found to be most crucial to green plants. The impact of the light source on the efficacy of plant photosynthesis has been studied by American and Japanese scholars, and ideal spectrums have been studied. It is found that when the light source a plant is exposed to during growth resembles the ideal spectrum for plant growth, plant photosynthesis takes place more efficiently. At present, full spectrums are mainly applied in the field of LED lighting and lack wider applications in other fields. Moreover, no relevant technical solutions are provided in the fields of meat irradiation, seafood irradiation, pastry irradiation, and plant irradiation.

In order to overcome the shortcomings of the prior art, the inventor thus needs to solve the problem of designing a full-spectrum LED and applications thereof which can be used in meat irradiation and seafood irradiation, such that meat and seafood appear more fresh, and which can further be used as a light source for pastry irradiation to give pastries a more appealing and delicious appearance.

SUMMARY

Regarding the shortcomings of the prior art, the present invention aims to provide a full -spectrum light emitting diode (LED) and applications thereof. The full-spectrum LED is simple in structure and easy to use. A full-spectrum LED light source in the present invention can be adjusted to simulate natural light irradiation so as to allow photosynthesis in plants and to irradiate food such as vegetables, fruits, seafood, meat, and bread in supermarkets, stores, and vegetable markets, such that the products look fresher and more delicious. Hence the present invention is of excellent practical value.

The technical solutions adopted by the present invention to solve the technical problem thereof are as follows: a full-spectrum LED, wherein the full-spectrum LED comprises blue LED chips, a fluorescent powder composition, and silica gel; the fluorescent powder composition is mixed with the silica gel; in the mixture of the fluorescent powder composition and the silica gel, the fluorescent powder composition accounts for 0-40% by weight, and the silica gel accounts for 60-100% by weight; the mixture of the fluorescent powder composition and the silica gel is applied on the blue LED chips; the blue LED chips are blue light emitting diode chips, and at least two blue LED chips are provided; the wavelengths of the two blue LED chips are respectively 430-450 nm and 450-470 nm; the two blue LED chips are connected via any one of head-to-tail serial connection and head-to-head, tail-to-tail parallel connection; the fluorescent powder composition comprises fluorescent powder of at least two different colors; the fluorescent powder composition comprises a mixture of red fluorescent powder of two wavelength bands; and when excited, the red fluorescent powder radiates one wavelength of 610-640 nm and another wavelength of 640-670 nm.

Further, in the full-spectrum LED, the fluorescent powder composition comprises green fluorescent powder radiating a wavelength of 520-540 nm when excited and a mixture of red fluorescent powder of two wavelength bands radiating one wavelength of 610-640 nm and another wavelength of 640-670 nm when excited; the green fluorescent powder accounts for 0-40% by weight, and the red fluorescent powder accounts for 60-100% by weight.

Further, in the full-spectrum LED, the fluorescent powder composition comprises green fluorescent powder radiating a wavelength of 520-540 nm when excited, yellow fluorescent powder radiating a wavelength of 540-570 nm when excited, and a mixture of red fluorescent powder of two wavelength bands radiating one wavelength of 610-640 nm and another wavelength of 640-670 nm when excited; the green fluorescent powder accounts for 0-60% by weight; the yellow fluorescent powder accounts for 0-70% by weight; and the red fluorescent powder accounts for 0-40% by weight.

Further, in the full-spectrum LED, the fluorescent powder composition comprises yellow fluorescent powder radiating a wavelength of 540-570 nm when excited and a mixture of red fluorescent powder of two wavelength bands radiating one wavelength of 610-640 nm and another wavelength of 640-670 nm when excited; the yellow fluorescent powder accounts for 60-100% by weight, and the red fluorescent powder accounts for 0-40% by weight.

Application of the full-spectrum light emitting diode (LED): uses of the full-spectrum LED include, but are not limited to, plant growth irradiation, meat irradiation, seafood irradiation, and pastry irradiation.

Further, in the LED used for plant growth, the fluorescent powder composition comprises green fluorescent powder radiating a wavelength of 520-540 nm when excited and a mixture of red fluorescent powder of two wavelength bands radiating one wavelength of 610-640 nm and another wavelength of 640-670 nm when excited. For this spectrum of the LED used for plant growth, the CIE chromaticity coordinate x value is 0.33-0.5, and the y value is 0.13-0.33.

Further, in the LED used for meat irradiation, the fluorescent powder composition comprises green fluorescent powder radiating a wavelength of 520-540 nm when excited and a mixture of red fluorescent powder of two wavelength bands radiating one wavelength of 610-640 nm and another wavelength of 640-670 nm when excited. For this spectrum of the LED used for meat irradiation, the CIE chromaticity coordinate x value is 0.32-0.43, and the y value is 0.18-0.32.

Further, in the LED used for seafood irradiation, the fluorescent powder composition comprises green fluorescent powder radiating a wavelength of 515-540 nm when excited and a mixture of red fluorescent powder of two wavelength bands radiating one wavelength of 610-640 nm and another wavelength of 640-670 nm when excited. For this spectrum of the LED used for seafood irradiation, the CIE chromaticity coordinate x value is 0.11-0.28, and the y value is 0.11-0.33.

Further, in the LED used for pastry irradiation, the fluorescent powder composition comprises green fluorescent powder radiating a wavelength of 520-540 nm when excited and a mixture of red fluorescent powder of two wavelength bands radiating one wavelength of 610-640 nm and another wavelength of 640-670 nm when excited. For this spectrum of the LED used for pastry irradiation, the CIE chromaticity coordinate x value is 0.31-0.46, and the y value is 0.25-0.4.

The present invention has the following beneficial effects: An excited spectrum of the present invention is close to a plant photosynthesis curve, a meat irradiation curve, a biological growth curve, a seafood irradiation curve, a vegetable and fruit irradiation curve, and a pastry irradiation curve. A full-spectrum LED light source in the present invention can be adjusted to simulate natural light irradiation. The excited spectrum is close to the plant photosynthesis curve, thereby causing photosynthesis in plants, achieving an optimal plant growth effect. Further, the present invention achieves the effects of optimal freshness preservation in meat irradiation, seafood irradiation, and vegetable and fruit irradiation, and ensures optimal deliciousness in pastry irradiation. The present invention can be used to irradiate food such as vegetables, fruits, seafood, meat, and bread in supermarkets, stores, and vegetable markets, so that the products look fresher and more delicious.

BRIEF DESCRIPTION OF THE DRAWINGS

FIG. 1 is a schematic structural diagram of the present invention.

Reference numerals: 1—Base; 2—Blue LED chip; 3—Fluorescent powder composition; 4—Silica gel.

DETAILED DESCRIPTION

The present invention will be further described below with reference to specific embodiments. It should be understood that these embodiments are merely intended to describe the present invention, and are not intended to limit the scope of the present invention. It should be understood that after reading the content of the present invention, persons skilled in the art can make various changes or modifications to the present invention, and these equivalent forms also fall within the scope defined by the claims appended to the application.

Please refer to FIG. 1 which is a schematic structural diagram of the present invention. A full-spectrum light emitting diode (LED) includes a base 1, blue LED chips 2, a fluorescent powder composition 3, and silica gel 4. The fluorescent powder composition 3 is mixed with the silica gel 4. In the mixture of the fluorescent powder composition 3 and the silica gel 2, the fluorescent powder composition 3 accounts for 0-40% by weight, and the silica gel 4 accounts for 60-100% by weight. The mixture of the fluorescent powder composition 3 and the silica gel 4 is applied on the blue LED chips 2. The blue LED chips are blue light emitting diode chips, and at least two blue LED chips are provided. The wavelengths of the two blue LED chips are respectively 430-450 nm and 450-470 nm The two blue LED chips are connected via any one of head-to-tail serial connection and head-to-head, tail-to-tail parallel connection. The fluorescent powder composition includes fluorescent powder of at least two different colors. The fluorescent powder composition includes a mixture of red fluorescent powder of two wavelength bands. When excited, the red fluorescent powder radiates one wavelength of 610-640 nm and another wavelength of 640-670 nm.

Specific Embodiment 1

In the full-spectrum LED, the fluorescent powder composition includes green fluorescent powder radiating a wavelength of 520-540 nm when excited and a mixture of red fluorescent powder of two wavelength bands radiating one wavelength of 610-640 nm and another wavelength of 640-670 nm when excited. The green fluorescent powder accounts for 0-40% by weight, and the red fluorescent powder accounts for 60-100% by weight.

Specific Embodiment 2

In the full-spectrum LED, the fluorescent powder composition includes green fluorescent powder radiating a wavelength of 520-540 nm when excited, yellow fluorescent powder radiating a wavelength of 540-570 nm when excited, and a mixture of red fluorescent powder of two wavelength bands radiating one wavelength of 610-640 nm and another wavelength of 640-670 nm when excited. The green fluorescent powder accounts for 0-60% by weight; the yellow fluorescent powder accounts for 0-70% by weight; and the red fluorescent powder accounts for 0-40% by weight.

Specific Embodiment 3

In the full-spectrum LED, the fluorescent powder composition includes yellow fluorescent powder radiating a wavelength of 540-570 nm when excited and a mixture of red fluorescent powder of two wavelength bands radiating one wavelength of 610-640 nm and another wavelength of 640-670 nm when excited. The yellow fluorescent powder accounts for 60-100% by weight, and the red fluorescent powder accounts for 0-40% by weight.

Specific Embodiment 4

In the LED used for plant growth, the fluorescent powder composition includes green fluorescent powder radiating a wavelength of 520-540 nm when excited and a mixture of red fluorescent powder of two wavelength bands radiating one wavelength of 610-640 nm and another wavelength of 640-670 nm when excited. For this spectrum of the LED used for plant growth, the CIE chromaticity coordinate x value is 0.33-0.5, and they value is 0.13-0.33.

Specific Embodiment 5

In the LED used for meat irradiation, the fluorescent powder composition includes green fluorescent powder radiating a wavelength of 520-540 nm when excited and a mixture of red fluorescent powder of two wavelength bands radiating one wavelength of 610-640 nm and another wavelength of 640-670 nm when excited. For this spectrum of the LED used for meat irradiation, the CIE chromaticity coordinate x value is 0.32-0.43, and the y value is 0.18-0.32.

Specific Embodiment 6

In the LED used for seafood irradiation, the fluorescent powder composition includes green fluorescent powder radiating a wavelength of 515-540 nm when excited and a mixture of red fluorescent powder of two wavelength bands radiating one wavelength of 610-640 nm and another wavelength of 640-670 nm when excited. For this spectrum of the LED used for seafood irradiation, the CIE chromaticity coordinate x value is 0.11-0.28, and the y value is 0.11-0.33.

Specific Embodiment 7

In the LED used for pastry irradiation, the fluorescent powder composition includes green fluorescent powder radiating a wavelength of 520-540 nm when excited and a mixture of red fluorescent powder of two wavelength bands radiating one wavelength of 610-640 nm and another wavelength of 640-670 nm when excited. For this spectrum of the LED used for pastry irradiation, the CIE chromaticity coordinate x value is 0.31-0.46, and the y value is 0.25-0.4.

What is claimed is:

1. A full-spectrum light emitting diode (LED), wherein the full-spectrum LED comprises at least two blue LED chips, a fluorescent powder composition, and a silica gel, wherein:
the fluorescent powder composition is mixed with the silica gel;
in the mixture of the fluorescent powder composition and the silica gel, the fluorescent powder composition accounts for 0-40% by weight, and the silica gel accounts for 60-100% by weight;
the mixture of the fluorescent powder composition and the silica gel is applied on the at least two blue LED chips;
the at least two blue LED chips include a first blue LED chip and a second blue LED chip, wherein:
the first blue LED chip emits a first wavelength of 430-450 nm, and the second blue LED chip emits a second wavelength of 450-470 nm; and
the first blue LED chip and the second blue LED chip are connected via head-to-tail serial connection or via head-to-head, tail-to-tail parallel connection;
the fluorescent powder composition comprises fluorescent powder of at least two different colors; and
the fluorescent powder composition comprises a mixture of red fluorescent powder of two wavelength bands, such that when excited, the red fluorescent powder radiates a third wavelength of 610-640 nm and a fourth wavelength of 640-670 nm.

2. The full-spectrum LED according to claim 1, wherein:
the fluorescent powder composition further comprises a green fluorescent powder that radiates a fifth wavelength of 520-540 nm when excited; and
the green fluorescent powder accounts for 0-40% of the fluorescent powder composition by weight, and the red fluorescent powder accounts for 60-100% by weight.

3. The full-spectrum LED according to claim 1, wherein:
the fluorescent powder composition further comprises a green fluorescent powder that radiates a fifth wavelength of 520-540 nm when excited;
the fluorescent powder composition further comprises a yellow fluorescent powder that radiates a sixth wavelength of 540-570 nm when excited; and
the green fluorescent powder accounts for 0-60% of the fluorescent powder composition by weight, the yellow fluorescent powder accounts for 0-70% by weight; and the red fluorescent powder accounts for 0-40% by weight.

4. The full-spectrum LED according to claim 1, wherein:
the fluorescent powder composition further comprises a yellow fluorescent powder that radiates a fifth wavelength of 540-570 nm when excited; and
the yellow fluorescent powder accounts for 60-100% by weight, and the red fluorescent powder accounts for 0-40% by weight.

5. The full-spectrum LED according to claim 1, wherein the full-spectrum LED is adapted for one or more of plant growth irradiation, meat irradiation, seafood irradiation, and pastry irradiation.

6. The full-spectrum LED according to claim 5, wherein in the full-spectrum LED adapted for plant growth;
the fluorescent powder composition further comprises a green fluorescent powder that radiates a fifth wavelength of 520-540 nm when excited; and
the full-spectrum LED produces a spectrum having a CIE chromaticity coordinate x value of 0.33-0.5 and y value of 0.13-0.33.

7. The full-spectrum LED according to claim 5, wherein in the full-spectrum LED adapted for meat irradiation:
the fluorescent powder composition further comprises a green fluorescent powder that radiates a fifth wavelength of 520-540 nm when excited; and
the full-spectrum LED produces a spectrum having a CIE chromaticity coordinate x value of 0.32-0.43 and y value of 0.18-0.32.

8. The full-spectrum LED according to claim 5, wherein in the full-spectrum LED adapted for seafood irradiation:
the fluorescent powder composition further comprises a green fluorescent powder that radiates a fifth wavelength of 515-540 nm when excited; and
the full-spectrum LED produces a spectrum having a CIE chromaticity coordinate x value of 0.11-0.28 and y value of 0.11-0.33.

9. The full-spectrum LED according to claim 5, wherein in the full-spectrum LED adapted for pastry irradiation:
the fluorescent powder composition further comprises a green fluorescent powder that radiates a fifth wavelength of 520-540 nm when excited; and
the full-spectrum LED produces a spectrum having a CIE chromaticity coordinate x value of 0.31-0.46 and y value of 0.25-0.4.

* * * * *